United States Patent [19]
Yamato et al.

[11] Patent Number: 4,882,026
[45] Date of Patent: Nov. 21, 1989

[54] DIELECTRIC BLOCK PLATING APPARATUS

[75] Inventors: Osamu Yamato; Tetsuji Takino, both of Tokyo, Japan

[73] Assignee: Oki Electric Industry Co., Ltd., Tokyo, Japan

[21] Appl. No.: 189,165

[22] Filed: May 2, 1988

[30] Foreign Application Priority Data

May 1, 1987 [JP] Japan .................. 62-106347

[51] Int. Cl.⁴ .............................................. C25D 17/00
[52] U.S. Cl. ..................................................... 204/275
[58] Field of Search ........................ 204/273, 275, 276

[56] References Cited

U.S. PATENT DOCUMENTS 4,174,261 11/1979 Pellegrino ............................ 204/273
4,761,213 8/1988 Hosten ................................. 204/275

FOREIGN PATENT DOCUMENTS 59-185795 10/1984 Japan.

Primary Examiner—T. M. Tufariello
Attorney, Agent, or Firm—Wenderoth, Lind & Ponack

[57] ABSTRACT

A dielectric block plating apparatus provides electrolytic solution to be circulated through a plating tank in a substantially uniform flow through practically the entire interior of the plating tank to form conductive layers over predetermined areas of ground conductive layers formed on surfaces of a dielectric block having through holes extending from the top surface to the bottom surface thereof. The dielectric block is immersed and held in the electrolytic solution contained in the plating tank so that the respective center axes of the through holes of the dielectric block extend parallel to the direction of flow of the electrolytic solution.

9 Claims, 3 Drawing Sheets

DIELECTRIC BLOCK PLATING APPARATUS

BACKGROUND OF THE INVENTION

1. Field of the Invention

The present invention relates to a dielectric block plating apparatus for forming a plated layer by an electrolytic plating process over the surface of a dielectric block having through holes extending from the bottom surface to the top surface thereof.

2. Description of the Prior Art

Generally, a dielectric block plating process for forming a conductive layer comprises the following steps.

(1) washing and roughening the surface of a dielectric block made of ceramic material comprised of $TiO_2$ and BaO, (2) coating the surface of the dielectric block with a ground conductive layer through an electroless plating process, (3) coating a predetermined portion not to be coated with an upper conductive layer of the surface of the dielectric block with a resist material, (4) coating the surface of the dielectric block with an upper conductive layer by an electroplating process, and (5) removing the resist material and the ground conductive layer coated with the resist material.

When the dielectric block is plated by the foregoing dielectric block plating process to manufacture a dielectric filter having inner conductors in the through holes and an outer conductor at the surface of the block, the electrolytic solution is liable to stagnate in the through holes of the dielectric block and hence, the surfaces of the through holes may be coated with inner conductive layers having an insufficient thickness. The electric characteristics of such dielectric filter containing inner conductive layers (inner conductors) having an insufficient thickness do not meet desired electric characteristics.

There is a dielectric block plating process invented to solve the foregoing problem in Japanese Patent Laid-Open Publication No. 59-185795. This conventional dielectric block plating process requires a plurality of electrolytic solution injecting means to be disposed respectively adjacent and opposite to the through holes of a dielectric block. Accordingly, this dielectric block plating process requires the dielectric block to be set exactly at a predetermined position adjacent to the electrolytic solution injecting means.

Another conventional dielectric block plating process employs auxiliary anodes, which are respectively inserted in the through holes of a dielectric block to form inner conductors having a sufficient thickness.

SUMMARY OF THE INVENTION

Accordingly, it is an object of the present invention to provide a dielectric block plating apparatus capable of forming conductive layers having a uniform thickness over the surfaces of a dielectric block.

It is another object of the present invention to provide such a dielectric block plating apparatus having a simple construction.

It is a further object of the present invention to provide a dielectric block plating apparatus capable of satisfactorily coating the surfaces of the through holes of a dielectric block with conductive layers without the necessity of exactly positioning the through holes respectively adjacent and opposite to each of electrolytic solution injecting means for injecting the electrolytic solution into the through holes of the dielectric block, and of inserting auxiliary anodes in each of the through holes of the dielectric block.

It is still a further object of the present invention to provide such a dielectric block plating apparatus suitable for automation.

A process for using the apparatus of the present invention, for forming a conductive layer by an electroplating process over the surfaces of a dielectric block having through holes extending from the top surface to the bottom surface thereof and coated with a ground conductive layer formed by an electroless plating process in a plating tank filled with an electrolytic solution comprises steps of:

(1) immersing the dielectric block in the electrolytic solution, (2) causing the electrolytic solution to flow in the direction of the center axes of the through holes, (3) applying a negative voltage to the ground conductive layer, (4) applying a positive voltage to the electrolytic solution, and (5) removing the dielectric block from the electrolytic solution.

According to the present invention, the dielectric block plating apparatus for forming conductive layers over the surfaces of a dielectric block having through holes extending from the top surface to the bottom surface thereof and coated with a ground conductive layer formed by an electroless plating process in a plating tank filled with an electrolytic solution comprises:

(1) dielectric block holding means for holding the dielectric block in the electrolytic solution, (2) means for causing the electrolytic solution to flow in a direction parallel to the center axes of the through holes, (3) means for controlling the electric solution to flow in the direction of the center axis of the through holes, (4) means for applying a positive voltage to the electrolytic solution, and (5) means for applying a negative voltage to the ground conductive layer.

The above and other objects, features and advantages of the present invention will become apparent from the following description taken in conjunction with the accompanying drawings.

DESCRIPTION OF THE PREFERRED EMBODIMENT

Figure 1:
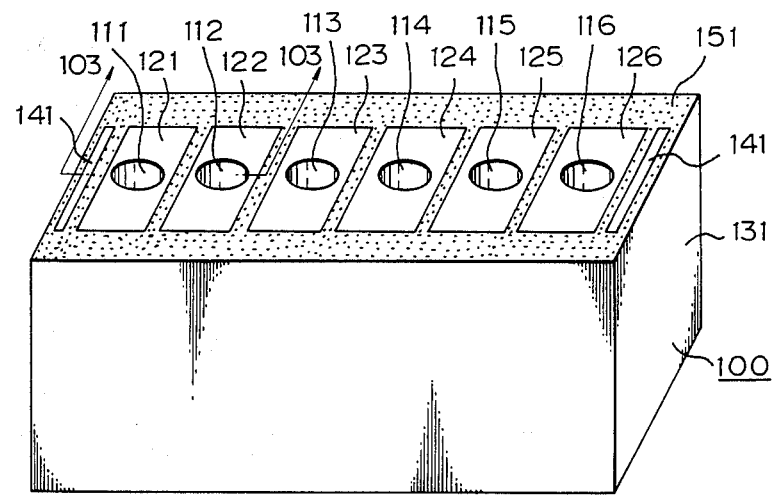
FIG. 1 is a perspective view of a dielectric block.
Figure 2:
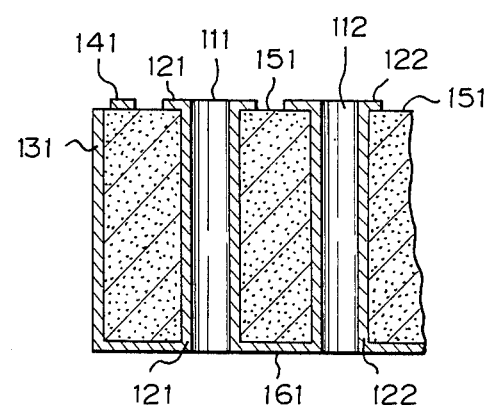
FIG. 2 is a sectional view taken on line 103—103 in FIG. 1.

Referring to FIGS. 1 and 2, a dielectric block 100 formed of a ceramic material containing $TiO_2$ and BaO has through holes 111 to 116 extending from the top surface to the bottom surface thereof. Conductive collared areas 121–126 for adjusting the capacitance of the dielectric block 100 are formed on the top surface of the dielectric block respectively around the edges of the through holes 111 to 116. Also formed on the top surface of the dielectric block 100 are electrodes 141. Indicated at 151 is a nonplated area in which no conductive layer is formed. An outer conductor 131 is formed on the side surfaces of the dielectric block 100. As best shown in FIG. 2, inner conductors 121 to 126 are formed respectively over the surfaces of the through holes 111 to 116. The inner conductors 121 to 126 are connected electrically to the outer conductor 131 by a bottom conductor 161.

Figure 3:
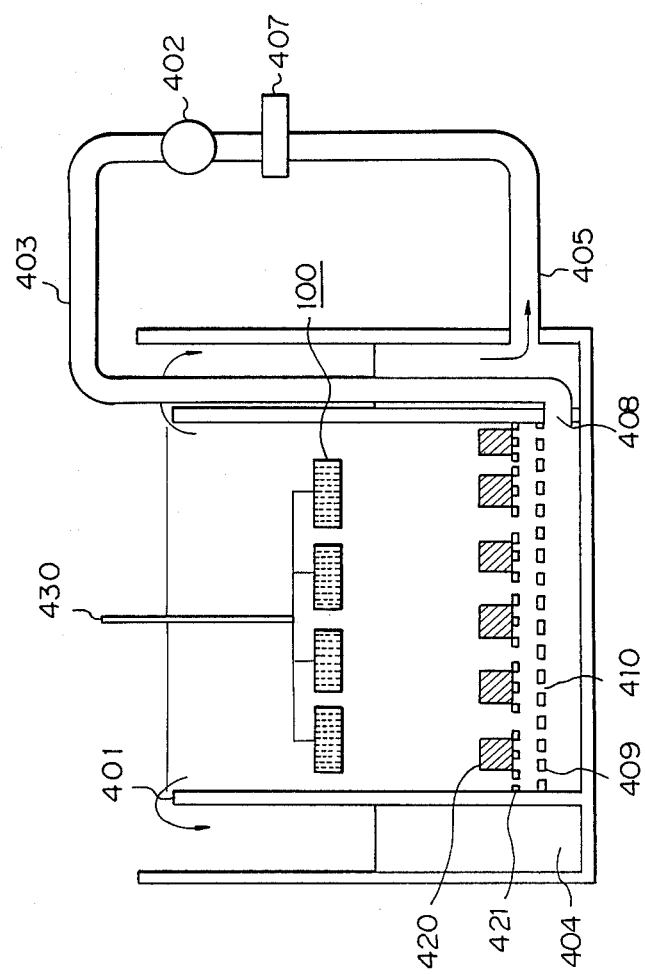
FIG. 3 is a sectional view of a dielectric block plating apparatus according to a preferred embodiment of the present invention.
Figure 4:
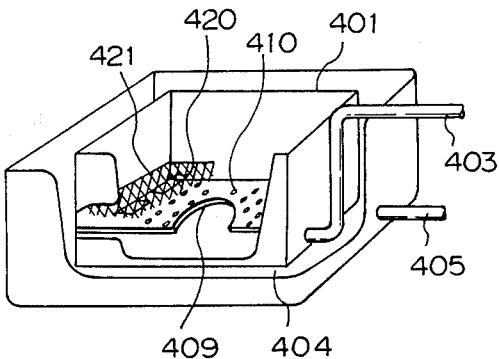
FIG. 4 is a fragmentary cutaway perspective view of the dielectric block plating apparatus of FIG. 3.

FIGS. 3 and 4 show a dielectric block plating apparatus according to a preferred embodiment of the present invention. A plating tank 401 is filled with an electrolytic solution. The dielectric block 100 is immersed in the electrolytic solution in the plating tank 401 for electrolytic plating. The electrolytic solution is pumped for circulation through the plating tank 401 by a pump 402. The electrolytic solution, for example, for silver plating contains $KAg(CN)_2$ and KCN. The electrolytic solution pumped by the pump 402 is supplied into the plating tank 401 through a supply pipe 403, such as a vinyl chloride pipe, connected to a pipe joint 408 connected to the bottom of the plating tank 401 so that the electrolytic solution will overflow the plating tank 401. The electrolytic solution overflows the plating tank 401 into a sump 404 formed around the plating tank 401 between the walls of the plating tank 401 and an external casing. A return pipe 405 has one end connected to the bottom of the external casing and the other end connected to the pump 402. The overflow electrolytic solution contained in the sump 404 is returned through the return pipe 405 to the pump 402. Preferably, a filter unit 407 is provided in the return pipe 405.

Flow control devices for forming a uniform flow of the electrolytic solution within the plating tank 401 will be described hereinafter.

In FIGS. 3 and 4, the flow control device is embodied in a flow control plate 409 having small perforations 410. The perforations are distributed over the entire area of the flow control plate 409. The electrolytic solution supplied through the supply pipe 403 into the plating tank 401 is distributed uniformly by the flow control plate 409, so that a substantially uniform flow of the electrolytic solution is formed within the plating tank 401.

Figure 5:
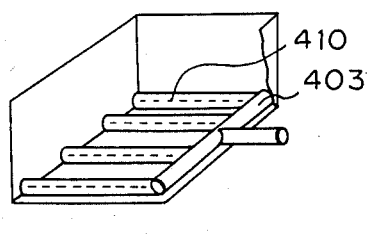
FIGS. 5 and 6 are perspective views of assistance in explaining the construction of an electrolytic solution supply unit incorporated into the dielectric block plating apparatus of FIG. 3.

In FIG. 5, the flow control device is embodied in a manifold formed by branching the free end of the supply pipe 403 into a plurality of branches on the bottom wall of the plating tank 401. A plurality of through holes 410 are formed in the manifold to spout the electrolytic solution uniformly therethrough into the plating tank 401.

Figure 6:
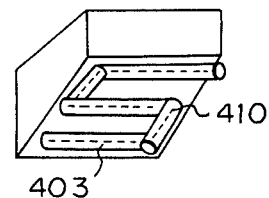

In FIG. 6, the flow control device is embodied in a zigzag-shaped pipe formed by bending the free end of the supply pipe 403 in a zigzag shape on the bottom wall of the plating tank 401. A plurality of through holes 410 are formed in the zigzag-shaped pipe to spout the electrolytic solution therethrough uniformly into the plating tank 401.

The perforated plate, the manifold and the zigzag-shaped pipe are equivalent to each other in the effect of forming a uniform flow of the electrolytic solution within the plating tank 401.

Anodes 420 for applying a positive voltage to the electrolytic solution are arranged within the plating tank 401. Each anode 420 is, for example for silver plating, a rectangular plate formed of pure silver. The anodes 420 are fixed to an anode holding structure 421, such as a net or a cage, formed of Ti as shown in FIGS. 3 and 4. The anode holding structure 421 holding the anodes 420 is fixedly placed within the plating tank 401.

Figure 7:
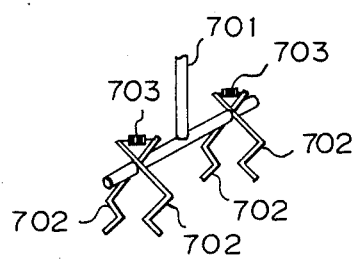
FIG. 7 is a perspective view of a holding device for holding a dielectric block.
Figure 8:
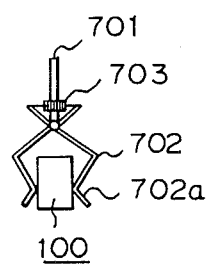
FIG. 8 is a side elevation of the holding device holding a dielectric block.

Referring to FIGS. 7 and 8, a holding device 430 (FIG. 3) for holding the dielectric block 100 within the plating tank 401 to immerse the dielectric block 100 in the electrolytic solution is formed of a material which will not dissolve in the electrolytic solution and in a solution for removing material plated over the surface of the holding device 430, for example, a stainless steel material or piano wires. The holding device 430 comprises a frame 701, a pair of grippers 702 for gripping the dielectric block 100, and springs 703 biasing the pair of grippers 702 so as to grip the dielectric block 100 therebetween. The pair of grippers 702 are supported on the frame 701. When the pair of grippers 702 are formed of a resilient material in a shape capable of holding the dielectric block 100 therebetween, the springs 703 need not be provided. The respective pairs of grippers 702 are closed when no dielectric block is held therebetween. In holding the dielectric block 100, the pair of grippers 702 are opened to receive the dielectric block 100 therebetween as shown in FIG. 8. The pair of grippers 702 are connected electrically to the frame 701, so a voltage applied to the frame 701 can be applied to the ground conductive layer over the surfaces of the dielectric block 100.

Thus, a positive voltage is applied to the anodes 420 and a negative voltage is applied to the ground conductive layer formed over the surfaces of the dielectric block 100. Thereby an upper conductive layer is formed over the predetermined area of the ground conductive layer.

Although the invention has been described in its preferred form with a certain degree of particularity, obviously many changes and variations are possible therein. It is therefore to be understood that the present invention may be practiced otherwise than specifically described herein without departing from the scope and spirit thereof.

What is claimed is:

1. A dielectric block plating apparatus for forming conductive layers by an electroplating process over surfaces of a dielectric block, having parallel through holes extending from a top surface of the block to a bottom surface thereof and coated with a ground conductive layer formed by an electroless plating process, in a plating tank filled with an electrolytic solution, said apparatus comprising:

holding means for holding the dielectric block within the electrolytic solution in an orientation with axes of the through holes of the block extending in a direction;

electrolytic solution circulating means for circulating the electrolytic solution under pressure through said plating tank;

means for controlling the flow of the electrolytic solution so as to flow through said plating tank in said direction and thereby parallel to the axes of the through holes;

voltage applying means for applying a negative voltage to the ground conductive layer formed on the dielectric block; and voltage applying means for applying a positive voltage to the electrolytic solution, said positive voltage applying means being positioned within said plating tank to face and confront entrances of the through holes in the block when the block is held in said orientation by said holding means.

2. A dielectric block plating apparatus according to claim 1, further comprising sump means for containing overflowed electrolytic solution overflowed from said plating tank.

3. A dielectric block plating apparatus according to claim 2, further comprising discharge means for discharging the overflowed electrolytic solution contained in said sump means.

4. A dielectric block plating apparatus according to claim 3, wherein said circulating means comprises means for supplying the electrolytic solution discharged from said plating tank again into said plating tank.

5. A dielectric block plating apparatus according to claim 4, further comprising filtering means for filtering the discharged electrolytic solution.

6. A dielectric block plating apparatus according to claim 1, wherein said controlling means comprises a plate having a plurality of perforations and mounted within said plating tank.

7. A dielectric block plating apparatus according to claim 1, wherein said controlling means comprises a pipe disposed on the bottom of said plating tank and having a plurality of small through holes for discharge therethrough of the electrolytic solution therethrough.

8. A dielectric block plating apparatus according to claim 7, wherein said pipe is branched into a plurality of branch pipes on said bottom of said plating tank.

9. A dielectric block plating apparatus according to claim 7, wherein said pipe extends in a zigzag shape on said bottom of said plating tank.

* * * * *